US012731621B2

(12) United States Patent
Pagariya et al.

(10) Patent No.: US 12,731,621 B2
(45) Date of Patent: Sep. 8, 2026

(54) ALLOCATING THERMAL REGION TAGS IN A STORAGE DEVICE

(71) Applicant: SanDisk Technologies LLC, Austin, TX (US)

(72) Inventors: Darshan Pagariya, Bangalore (IN); Vishal Sharma, Bangalore (IN); Sourabh Sankule, Bangalore (IN)

(73) Assignee: SanDisk Technologies INC, Milpitas, CA (US)

( * ) Notice: Subject to any disclaimer, the term of this patent is extended or adjusted under 35 U.S.C. 154(b) by 226 days.

(21) Appl. No.: 18/615,141

(22) Filed: Mar. 25, 2024

(65) Prior Publication Data

US 2025/0299711 A1 Sep. 25, 2025

(51) Int. Cl.
*G11C 7/04* (2006.01)
*G11C 7/10* (2006.01)

(52) U.S. Cl.
CPC .............. *G11C 7/04* (2013.01); *G11C 7/1069* (2013.01); *G11C 7/1096* (2013.01)

(58) Field of Classification Search
CPC ....... G11C 7/04; G11C 7/1069; G11C 7/1096; G11C 16/10
USPC .......................................................... 365/211
See application file for complete search history.

(56) References Cited

U.S. PATENT DOCUMENTS 10,379,739 B1 8/2019 Bazarsky
10,475,523 B2 11/2019 Sharon
11,210,031 B1 12/2021 Mekhanik
11,385,802 B2 7/2022 Sharon
12,210,759 B2 * 1/2025 Kientz .................. G06F 3/0644
2019/0392907 A1 * 12/2019 Her ........................ G06F 3/0659
2022/0113894 A1 4/2022 Avraham
2023/0153003 A1 5/2023 Sheperek

* cited by examiner

*Primary Examiner* — Huan Hoang
(74) *Attorney, Agent, or Firm* — Arlene P. Neal; NEAL BLIBO LLC

(57) ABSTRACT

A storage device allocates a thermal region tag (TRT) to a meta block based on a programming temperature and other conditions that may affect an optimal TRT parameter. A controller in the storage device programs a meta block and obtains a current temperature, a first TRT associated with the current temperature, and a parameter associated with the first TRT when closing the meta block. The controller determines that the first TRT has been active for more than a predefined active period, a temperature fluctuation across a predefined number of thermal regions occurred during previous meta blocks programming, and/or a number of meta blocks assigned to the first TRT is greater than a TRT compaction threshold. The controller deactivates the first TRT, allocates a second TRT to a thermal region including the current temperature, and assigns the second TRT to the meta block.

20 Claims, 6 Drawing Sheets

ALLOCATING THERMAL REGION TAGS IN A STORAGE DEVICE

BACKGROUND OF THE INVENTION

A storage device may be communicatively coupled to a host and to non-volatile memory including, for example, a NAND flash memory device on which the storage device may store data received from the host. The storage device may store data in blocks on the memory device. A group of memory meta blocks that are written at similar temperature ranges may be expected to have similar stress and Bit Error Rate (BER) and may be marked with a thermal region tag (TRT). For example, meta blocks programmed at zero to thirty-five degrees Celsius (° C.) may be assigned to a first TRT, meta blocks programmed at thirty-six to seventy-five ° C. may be assigned to a second TRT, and meta blocks programmed above seventy-five ° C. may be assigned to a third TRT.

A BER check may be carried out on an indicative word line selected from a block. The indicative word line may represent the word line with the highest flip-bit-count in the block. A BER Estimation Scan (BES) check may also be carried out on a representative word line selected from the block. The representative word line may represent the block and may have, for example, the same number of shifts as the block. Based on the BES check, TRT parameters such as the read voltage range may be obtained, updated, and assigned to a TRT so that when a controller on the storage device later performs a host read on a meta block assigned the TRT, the host read may return a low BER with few errors that may be corrected using the decoding capacity of the storage device. TRT parameters may thus be deemed optimal when the TRT parameters used in a host read result in a low BER. In cases where non-optimal parameters are associated with a TRT, the host read may return a high BER and decode failures, which may cause performance degradation and/or read timeouts. As such, to ensure that the optimal TRT parameters are associated with a TRT, the TRT parameters may require periodic refresh and fine tuning to fit changing conditions including, for example, temperature variance, potential data retention problems, etc.

As a TRT is currently assigned to a meta block based on the current temperature at which the meta block is programmed, there is a possibility that most of the meta blocks in the memory device may be assigned to a single TRT. Consider an example where the memory device includes 900 meta blocks. If these meta blocks are programmed at temperatures that fall within a given temperature range which is assigned a single TRT (for example, zero to thirty-five ° C.), then all the meta blocks may be assigned to the same TRT. If, for example, meta blocks 0-50 were programmed one month before meta blocks 600-900, when reading the data from the memory device, the controller may apply specific voltages to sense the stored charge levels. Accurate sensing may ensure reliable data retrieval and error correction. As there was a time difference in programming blocks 0-50 and blocks 600-900, the controller may need to apply different sense voltages to blocks 0-50 and blocks 600-900. However, because meta blocks 0-50 and blocks 600-900 were assigned to the same TRT, the controller may apply the same TRT parameters when reading all the meta blocks. In the example above, given the time difference in programming the meta blocks, the sense voltage that may be optimal for blocks 0-50 may not be optimal for blocks 600-900, which may increase the chances of read failures. In addition to programming meta blocks within the same temperature range at different times, other programming conditions may affect the optimal TRT parameters. There is thus a need to determine programming conditions that may affect the optimal TRT parameters and to allocate TRTs to meta blocks based on the programming temperature and these other conditions that may affect the optimal TRT parameters.

SUMMARY OF THE INVENTION

In some implementations, the storage device may allocate a thermal region tag (TRT) to a meta block in a memory device based on a programming temperature and other conditions that may affect an optimal TRT parameter. The storage device includes a controller that may program the meta block. When closing the meta block, the controller may obtain a current temperature, a first TRT associated with the current temperature, and a parameter associated with the first TRT. The controller may also determine if a condition exists to affect an optimal TRT parameter. If the condition exists, the controller may deactivate the first TRT, allocate a second TRT to a thermal region including the current temperature, and assign the second TRT to the meta block.

In some implementations, a method is provided for allocating a TRT to a meta block in a storage device based on a programming temperature and other conditions that may affect an optimal TRT parameter. The method includes programming the meta block and obtaining a current temperature, a first TRT associated with the current temperature, and a parameter associated with the first TRT when closing the meta block. The method also includes determining if a condition exists to affect an optimal first TRT parameter. The method further includes, if the condition exists, deactivating the first TRT, allocating a second TRT to a thermal region including the current temperature, and assigning the second TRT to the meta block.

In some implementations, a storage device may allocate a TRT to a meta block based on a programming temperature and other conditions that may affect an optimal TRT parameter. A controller on the storage device may program a meta block and obtain a current temperature, a first TRT associated with the current temperature, and a parameter associated with the first TRT when closing the meta block. The controller may also determine that the first TRT has been active for more than a predefined active period, a temperature fluctuation across a predefined number of thermal regions occurred during previous meta blocks programming, and/or a number of meta blocks assigned to the first TRT is greater than a TRT compaction threshold. The controller may deactivate the first TRT, allocate a second TRT to a thermal region including the current temperature, and assign the second TRT to the meta block.

Figure 1:
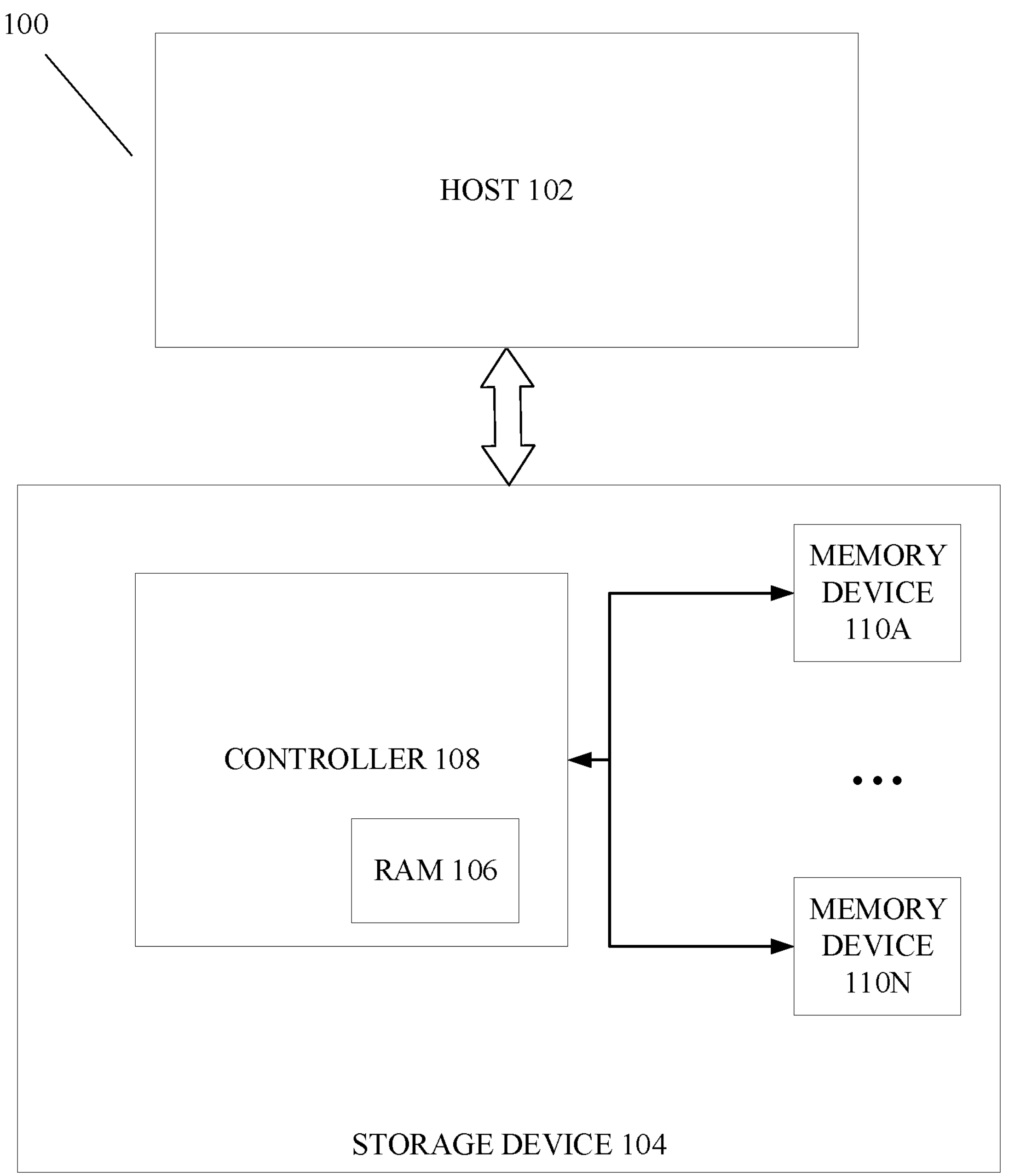
FIG. 1 is a schematic block diagram of an example system in accordance with some implementations.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of implementations of the present disclosure.

The apparatus and method components have been represented where appropriate by conventional symbols in the drawings, showing those specific details that are pertinent to understanding the implementations of the present disclosure so as not to obscure the disclosure with details that will be readily apparent to those of ordinary skill in the art.

DETAILED DESCRIPTION OF THE INVENTION

The following detailed description of example implementations refers to the accompanying drawings. The same reference numbers in different drawings may identify the same or similar elements.

FIG. 1 is a schematic block diagram of an example system in accordance with some implementations. System 100 includes a host 102 and a storage device 104. Host 102 and storage device 104 may be in the same physical location as components on a single computing device or on different computing devices that are communicatively coupled. Storage device 104, in various embodiments, may be disposed in one or more different locations relative to the host 102. System 100 may include additional components (not shown in this figure for the sake of simplicity).

Storage device 104 may include a random-access memory (RAM) 106, a controller 108, and one or more non-volatile memory devices 110*a*-110*n* (referred to herein as the memory device(s) 110). Storage device 104 may be, for example, a solid-state drive (SSD), and the like. RAM 106 may be temporary storage such as a dynamic RAM (DRAM) that may be used to cache information in storage device 104.

Memory device 110 may be flash based. For example, memory device 110 may be a NAND flash memory that may be used for storing host and control data over the operational life of memory device 110. Memory device 110 may be included in storage device 104 or may be otherwise communicatively coupled to storage device 104. Memory device 110 may be divided into blocks, wherein when data is erased from memory device 110, the entire block of data may be erased. Blocks in memory device 110 may be grouped together into a plane, and a die may include a single plane full of data blocks or multiple planes that have been linked together. The number and configurations of planes within a flash die may be adaptable. A meta block may be formed in an interleaved manner, wherein the meta block may include a block from each plane in a die.

Controller 108 may interface with host 102 and process foreground operations including instructions transmitted from host 102. For example, controller 108 may read data from and/or write to memory device 110 based on instructions received from host 102. Controller 108 may further execute background operations to manage resources on memory device 110. For example, controller 108 may monitor memory device 110 and may execute garbage collection and other relocation functions per internal relocation algorithms to refresh and/or relocate the data on memory device 110.

To write host data to memory device 110, controller 108 may select a meta block to program. After programming the meta block, controller 108 may read the current temperature when closing the meta block. Controller 108 may determine which predefined thermal region (i.e., a range of temperatures) includes the current temperature and whether an active Thermal Region Tag (TRT) is assigned to the thermal region. If when closing the meta block controller 108 determines that there in is a current/active TRT assigned to the thermal region that includes the current temperature, controller 108 may assign the current TRT assigned to the thermal region to the meta block.

If controller 108 determines there is no current/active TRT assigned to the thermal region that includes the current temperature, controller 108 may create a new TRT for the thermal region including the current temperature and allocate the new TRT to the meta block. When controller 108 creates the new TRT, controller 108 may update the TRT parameters including the read sense voltage. Controller 108 may use the TRT parameters when performing subsequent host reads on the meta block. To update the optimal TRT parameters for the new TRT, controller 108 may mark the TRT for a forced TRT update operation. Controller 108 may trigger a forced TRT update operation if, for example, controller 108 is unable to decode data on the meta block during a host read or if controller 108 creates a new TRT, allocates the TRT to a meta block, and marks the TRT for a forced TRT update operation. Controller 108 may also update the optimal parameters associated with a TRT during a periodic TRT update operation that may be performed after a predefined period.

A predefined thermal region may be assigned an active TRT. For example, a thermal region including temperatures between 0-35 degrees Celsius (° C.) may be assigned a first TRT as the active TRT, a thermal region including temperatures between 36-75° C. may be assigned a second TRT as the active TRT, and a thermal region including temperatures above 75° C. may be assigned a third TRT as the active TRT. It should be noted that the thermal regions may be defined to include smaller or greater temperature ranges and that the thermal regions provided herein are provided only as examples.

If, using the exemplary predefined thermal regions, after programming a meta block controller 108 reads, for example, a 25° C. temperature, controller 108 may obtain the first TRT. Controller 108 may also obtain one or more parameters associated with the first TRT. For example, controller 108 may also obtain a time when the first TRT was created and first assigned to a meta block. Controller 108 may also obtain a current TRT parameter for the first TRT. For example, controller 108 may read the current date and/or time from host 102 when closing the meta block being programmed and update a TRT management table. In another example, controller 108 may calculate the current date/time from a complementary metal-oxide semiconductor (CMOS) battery and update the TRT management table.

Before controller 108 assigns the active TRT (i.e., the first TRT) to the meta block, controller 108 may use one or more TRT parameters to determine if one or more conditions exist that may affect one or more TRT parameters. For example, controller 108 may use the time the first TRT was created and first allocated to a meta block and the current time to determine whether the active TRT for a thermal region has been active for more than a predefined active period. If controller 108 determines that the active TRT (i.e., the first TRT) has been active for more than the predefined active period, controller 108 may deactivate the active TRT. Controller may then allocate a new TRT to the thermal region, make the new TRT the active TRT for the thermal region, and update the parameters (including, for example, date/time) associated with the newly active TRT in the TRT management table.

Consider an example where a TRT may be active for up to three weeks and upon obtaining the first TRT for the meta block being programmed, controller 108 determines that the first TRT has been active for more than three weeks. Controller 108 may deactivate the active first TRT, allocate a fourth TRT to the temperature region including 0-35° C. temperatures and make the fourth TRT the active TRT for the temperature region including 0-35° C. temperatures. Controller 108 may update TRT parameters including the date/time associated with the fourth TRT in the TRT management table. Thereafter, when controller 108 selects a meta block to program and determines that the temperature when closing the meta block falls in the thermal region including 0-35° C. temperatures, controller may assign the fourth TRT to the meta block within the predefined active period.

Before controller assigns an active TRT to a meta block, controller 108 may also determine if there has been a temperature fluctuation across a predefined number of thermal regions when programming meta blocks. Using the example above where the first TRT is assigned as the active TRT for a thermal region including 0-35° C. temperatures, the second TRT is assigned as the active TRT for a thermal region including 36-75° C. temperatures, and the third TRT is assigned as the active TRT for a thermal region including above 75° C. temperatures, if after programming the first meta block, controller 108 reads, for example, a 25° C. temperature, controller 108 may assigned the first TRT to the first meta block. If after programming a second meta block, controller 108 reads, for example, a 76° C. temperature, controller 108 may assigned the third TRT to the second meta block. If after programming a third meta block, controller 108 reads, for example, a 20° C. temperature, rather than assigning the first TRT to the third meta block, controller 108 may determine that the temperature has fluctuated across a predefined number of thermal regions. In this example, controller 108 may determine that the temperature has fluctuated across more than two thermal regions. When controller 108 determines that the temperature has fluctuated across a predefined number of thermal regions, controller may deactivate the first TRT, allocate a new TRT (i.e., a fourth TRT) to the temperature region including 0-35° C., make the fourth TRT the active TRT for the temperature region including 0-35° C., and assign the fourth TRT to the third meta block.

In some implementations, storage device 104 may include a meta block threshold. In some cases, the meta block threshold may be the number of meta blocks divided by a TRT compaction threshold. In an example where the maximum number of meta blocks is 915 and the TRT compaction threshold is 27, the meta block, threshold may be 915/27, i.e., 34. When controller 108 selects a meta block to program, controller 108 may read the temperature when closing the meta block. Consider again the example where the first TRT is assigned as the active TRT for a thermal region including 0-35° C. temperatures, the second TRT is assigned as the active TRT for a thermal region including 36-75° C. temperatures, and the third TRT is assigned as the active TRT for a thermal region including above 75° C. temperatures. If after programming a meta block, controller 108 reads, for example, an 18° C. temperature, controller 108 may also check the number of meta blocks assigned to the first TRT. If the number of meta blocks assigned to the first TRT is greater than the TRT compaction threshold, controller 108 may deactivate the first TRT, allocate a new TRT (i.e., a fourth TRT) to the temperature region including 0-35° C. temperatures, make the fourth TRT the active TRT for the temperature region including 0-35° C. temperatures, and assign the fourth TRT to the meta block.

Controller 108 may thus allocate TRTs to meta blocks based on the temperature recorded when programming the meta block and based on other conditions that may affect the TRT parameters. For example, controller 108 may allocate a new TRT to a thermal region when there is no change in the programming temperature range, wherein the new TRT may include parameters that take care of possible leakage to read voltage charge over a period. In another example, controller 108 may also limit the number of meta blocks assigned to a TRT, wherein by limiting the number of meta blocks controller 108 may ensure that the meta blocks assigned to the TRT were programmed under similar conditions and temperature. In another example, controller 108 may also allocate a new TRT to a thermal region when there is fluctuation in the programming temperature across a predefined number of thermal regions, wherein the new TRT may also include optimal TRT parameters including sense voltages.

Storage device 104 may perform these processes based on a processor, for example, controller 108 executing software instructions stored by a non-transitory computer-readable medium, such as storage component 110. As used herein, the term "computer-readable medium" refers to a non-transitory memory device. Software instructions may be read into storage component 110 from another computer-readable medium or from another device. When executed, software instructions stored in storage component 110 may cause controller 108 to perform one or more processes described herein. Additionally, or alternatively, hardware circuitry may be used in place of or in combination with software instructions to perform one or more processes described herein. Thus, implementations described herein are not limited to any specific combination of hardware circuitry and software. System 100 may include additional components (not shown in this figure for the sake of simplicity). FIG. 1 is provided as an example. Other examples may differ from what is described in FIG. 1.

Figure 2:
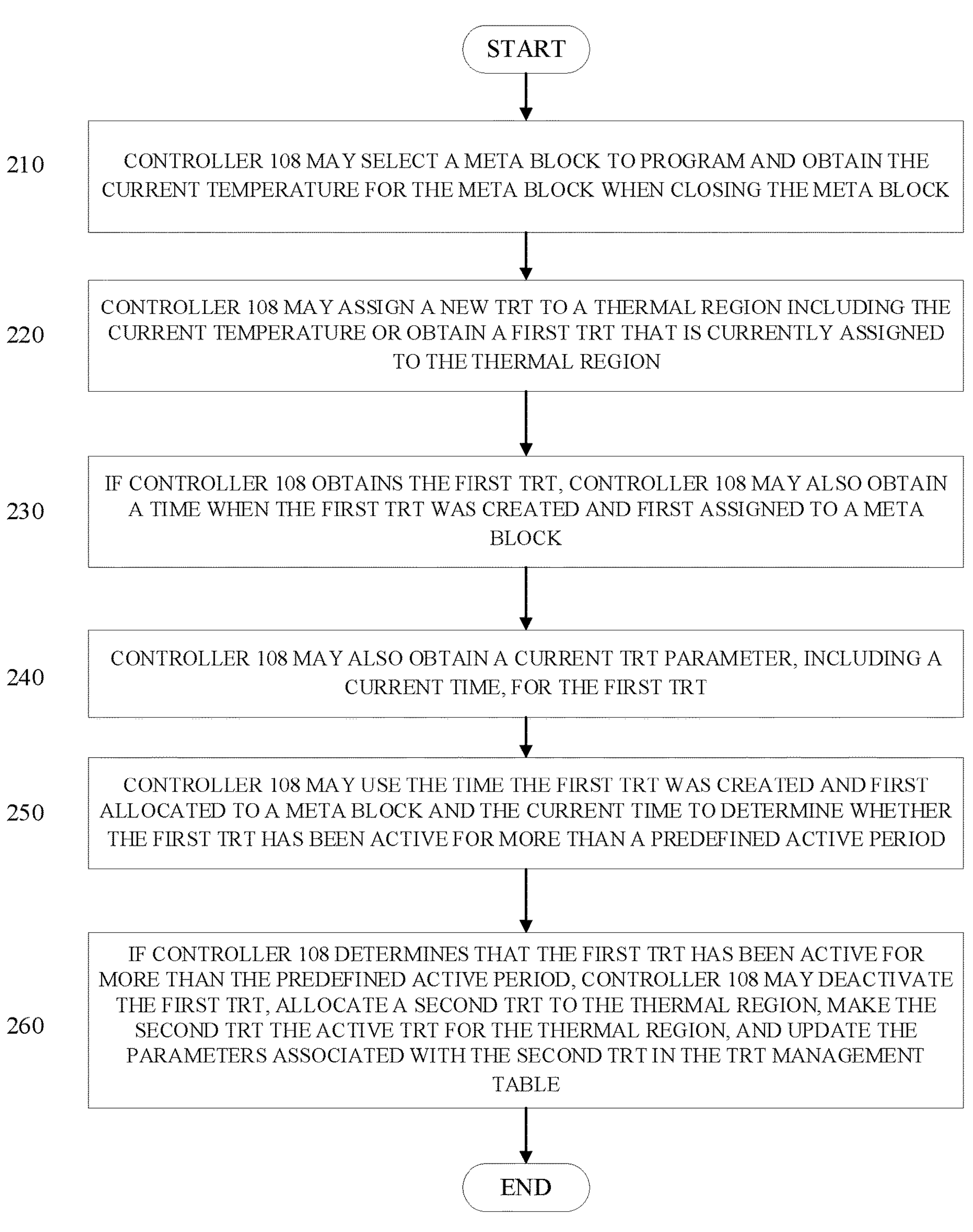
FIG. 2 is a flow diagram of an example process for allocating a Thermal Region Tag (TRT) in accordance with some implementations.

FIG. 2 is a flow diagram of an example process for allocating a Thermal Region Tag (TRT) in accordance with some implementations. At 210, controller 108 may select a meta block to program and obtain the current temperature for the meta block when closing the meta block. At 220, controller 108 may assign a new TRT to a thermal region including the current temperature or obtain a first TRT that is currently assigned to the thermal region. At 230, if controller 108 obtains the first TRT, controller 108 may also obtain a time when the first TRT was created and first assigned to a meta block. At 240, controller 108 may also obtain a current TRT parameter, including a current time, for the first TRT. At 250, controller 108 may use the time the first TRT was created and first allocated to a meta block and the current time to determine whether the first TRT has been active for more than a predefined active period. At 260, if controller 108 determines that the first TRT has been active for more than the predefined active period, controller 108 may deactivate the first TRT, allocate a second TRT to the thermal region, make the second TRT the active TRT for the thermal region, and update the parameters associated with the second TRT in the TRT management table. As indicated above FIG. 2 is provided as an example. Other examples may differ from what is described in FIG. 2.

Figure 3:
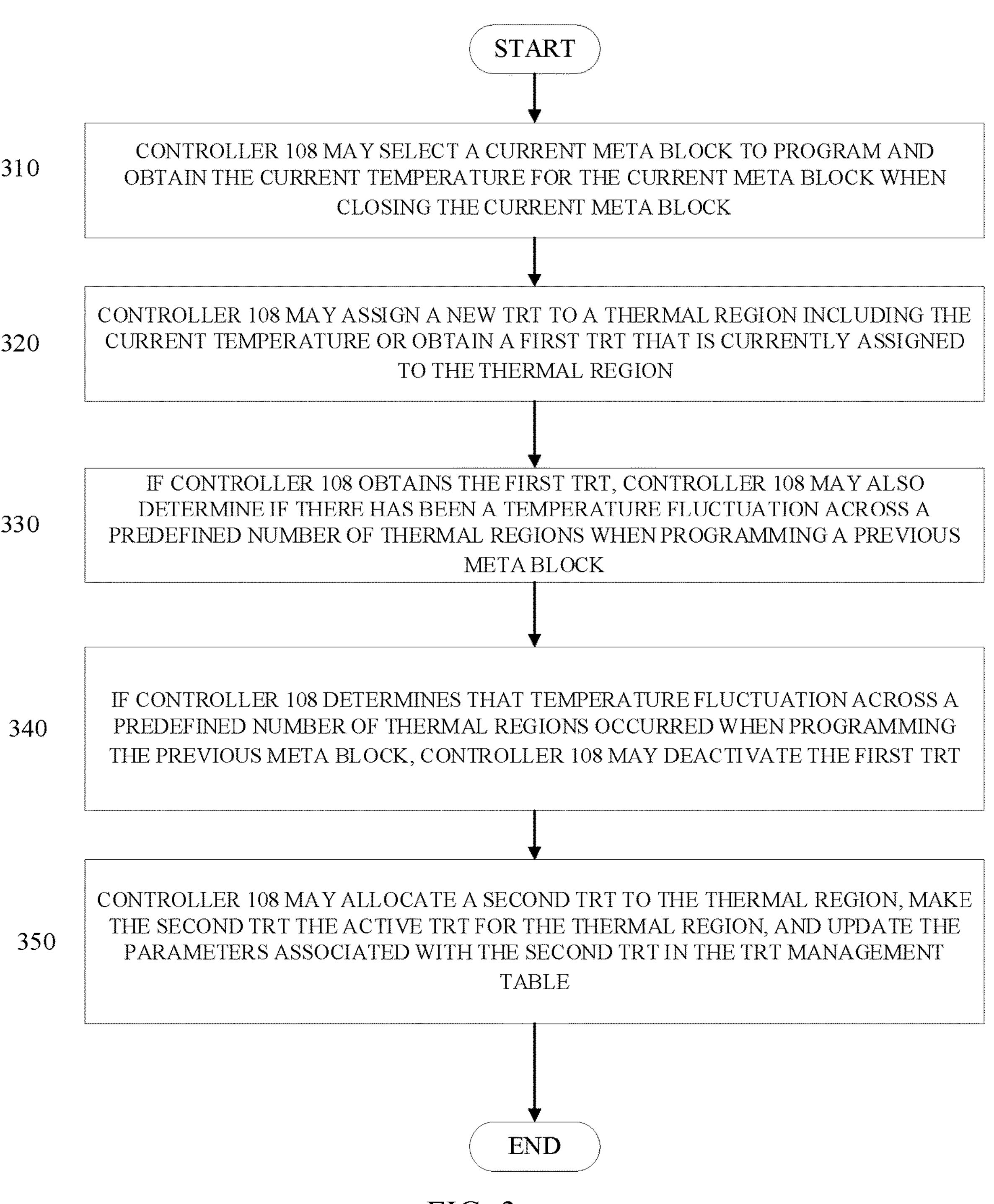
FIG. 3 is another flow diagram of an example process for allocating a TRT in accordance with some implementations.

FIG. 3 is another flow diagram of an example process for allocating a TRT in accordance with some implementations. At 310, controller 108 may select a current meta block to program and obtain the current temperature for the current meta block when closing the current meta block. At 320, controller 108 may assign a new TRT to a thermal region including the current temperature or obtain a first TRT that is currently assigned to the thermal region. At 330, if controller 108 obtains the first TRT, controller 108 may also determine if there has been a temperature fluctuation across a predefined number of thermal regions when programming a previous meta block. At 340, if controller 108 determines that temperature fluctuation across a predefined number of thermal regions occurred when programming the previous meta block, controller 108 may deactivate the first TRT. At 350, controller 108 may allocate a second TRT to the thermal region, make the second TRT the active TRT for the thermal region, and update the parameters associated with the second TRT in the TRT management table. As indicated above FIG. 3 is provided as an example. Other examples may differ from what is described in FIG. 3.

Figure 4:
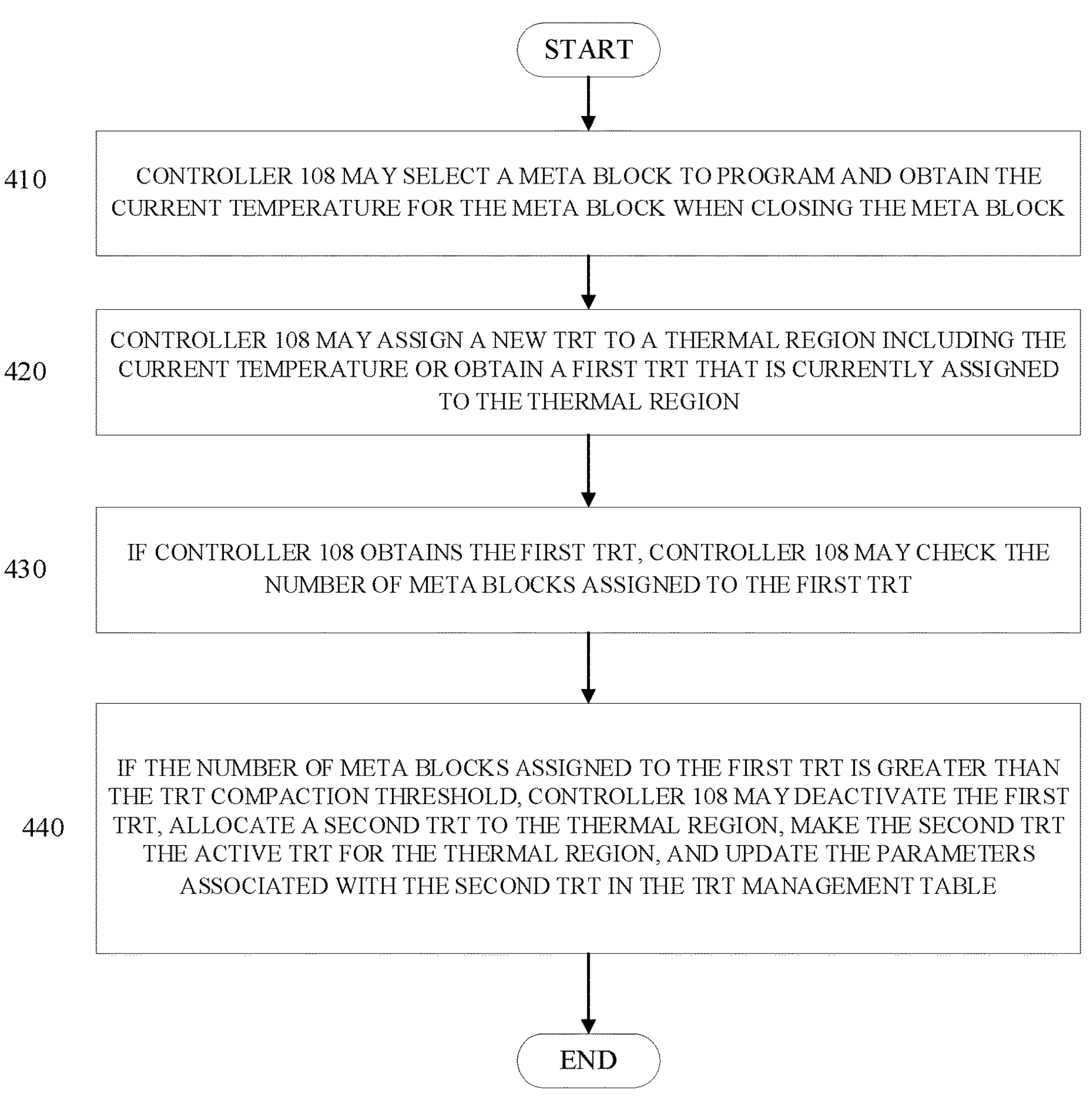
FIG. 4 is another flow diagram of an example process for allocating a TRT in accordance with some implementations.

FIG. 4 is another flow diagram of an example process for allocating a TRT in accordance with some implementations. At 410, controller 108 may select a meta block to program and obtain the current temperature for the meta block when closing the meta block. At 420, controller 108 may assign a new TRT to a thermal region including the current temperature or obtain a first TRT that is currently assigned to the thermal region. At 430, if controller 108 obtains the first TRT, controller 108 may check the number of meta blocks assigned to the first TRT. At 440, if the number of meta blocks assigned to the first TRT is greater than the TRT compaction threshold, controller 108 may deactivate the first TRT, allocate a second TRT to the thermal region, make the second TRT the active TRT for the thermal region, and update the parameters associated with the second TRT in the TRT management table. As indicated above FIG. 4 is provided as an example. Other examples may differ from what is described in FIG. 5.

Figure 5:
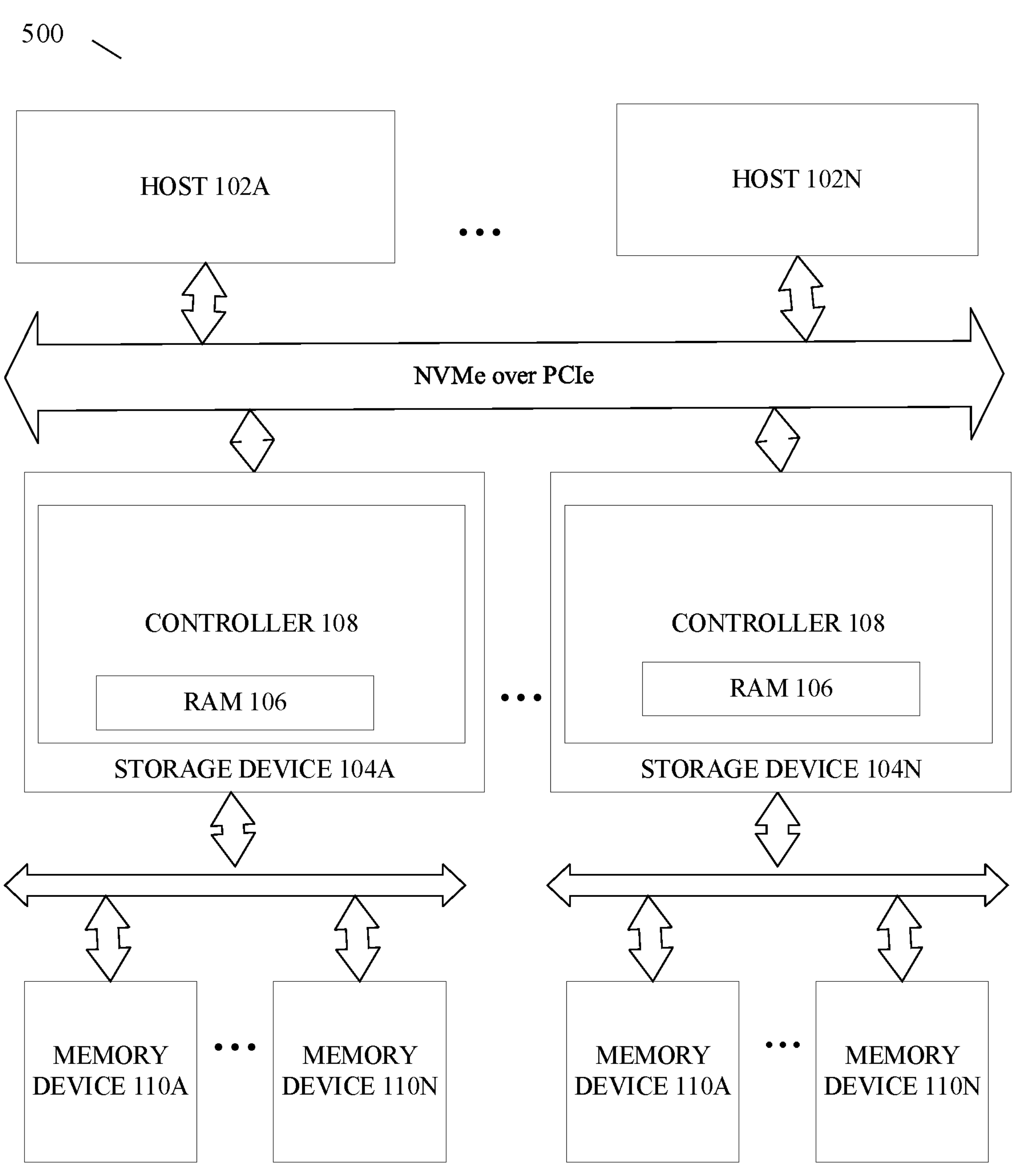
FIG. 5 is a diagram of an example environment in which systems and/or methods described herein are implemented.

FIG. 5 is a diagram of an example environment in which systems and/or methods described herein are implemented. As shown in FIG. 5, Environment 500 may include hosts 102-102*n* (referred to herein as host(s) 102), and one or more client storage devices 104*a*-104*n* (referred to herein as storage device(s) 104). Storage device 104 may include a controller 108 to allocate a TRT to a meta block based on the programming temperature of the meta block and other conditions that may affect optimal TRT parameters. Hosts 102 and storage devices 104 may communicate via Non-Volatile Memory Express (NVMe) over peripheral component interconnect express (PCI Express or PCIe), or the like.

Devices of Environment 500 may interconnect via wired connections, wireless connections, or a combination of wired and wireless connections. For example, the network in FIG. 5 may include NVMe over Fabric (NVMe-oF) Internet Small Computer Systems Interface (iSCSI), Fibre Channel (FC), Fibre Channel Over Ethernet (FCOE) connectivity and any another type of next-generation network and storage protocols, a local area network (LAN), a wide area network (WAN), a metropolitan area network (MAN), a private network, an ad hoc network, an intranet, the Internet, a fiber optic-based network, a cloud computing network, or the like, and/or a combination of these or other types of networks.

The number and arrangement of devices and networks shown in FIG. 5 are provided as an example. In practice, there may be additional devices and/or networks, fewer devices and/or networks, different devices and/or networks, or differently arranged devices and/or networks than those shown in FIG. 5. Furthermore, two or more devices shown in FIG. 5 may be implemented within a single device, or a single device shown in FIG. 5 may be implemented as multiple, distributed devices. Additionally, or alternatively, a set of devices (e.g., one or more devices) of Environment 500 may perform one or more functions described as being performed by another set of devices of Environment 500.

Figure 6:
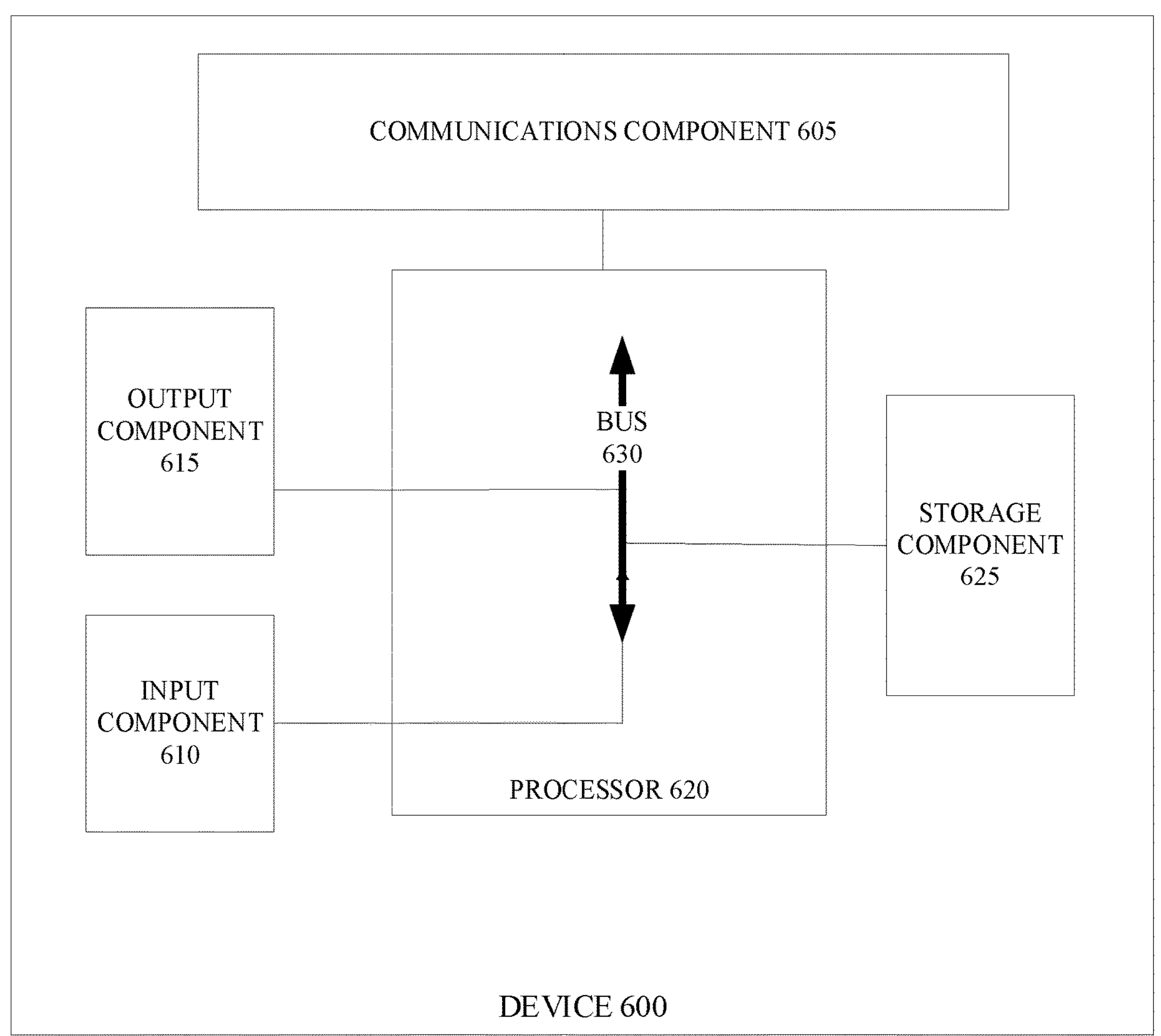
FIG. 6 is a diagram of example components of one or more devices of FIG. 1.

FIG. 6 is a diagram of example components of one or more devices of FIG. 1. In some implementations, host 102 may include one or more devices 600 and/or one or more components of device 600. Device 600 may include, for example, a communications component 605, an input component 610, an output component 615, a processor 620, a storage component 625, and a bus 630. Bus 630 may include components that enable communication among multiple components of device 600, wherein components of device 600 may be coupled to be in communication with other components of device 600 via bus 630.

Input component 610 may include components that permit device 600 to receive information via user input (e.g., keypad, a keyboard, a mouse, a pointing device, and a network/data connection port, or the like), and/or components that permit device 600 to determine the location or other sensor information (e.g., an accelerometer, a gyroscope, an actuator, another type of positional or environmental sensor). Output component 615 may include components that provide output information from device 600 (e.g., a speaker, display screen, and network/data connection port, or the like). Input component 610 and output component 615 may also be coupled to be in communication with processor 620.

Processor 620 may be a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 620 may include one or more processors capable of being programmed to perform a function. Processor 620 may be implemented in hardware, firmware, and/or a combination of hardware and software.

Storage component 625 may include one or more memory devices, such as random-access memory (RAM) 112, read-only memory (ROM), and/or another type of dynamic or static storage device (e.g., a flash memory, a magnetic memory, and/or optical memory) that stores information and/or instructions for use by processor 620. A memory device may include memory space within a single physical storage device or memory space spread across multiple physical storage devices. Storage component 625 may also store information and/or software related to the operation and use of device 600. For example, storage component 625 may include a hard disk (e.g., a magnetic disk, an optical disk, and/or a magneto-optic disk), a solid-state drive (SSD), a compact disc (CD), a digital versatile disc (DVD), a floppy disk, a cartridge, a magnetic tape, CXL device and/or another type of non-transitory computer-readable medium, along with a corresponding drive.

Communications component 605 may include a transceiver-like component that enables device 600 to communicate with other devices, such as via a wired connection, a wireless connection, or a combination of wired and wireless connections. The communications component 605 may permit device 600 to receive information from another device and/or provide information to another device. For example, communications component 605 may include an Ethernet interface, an optical interface, a coaxial interface, an infrared interface, a radio frequency (RF) interface, a universal serial bus (USB) interface, a Wi-Fi interface, and/or a cellular network interface that may be configurable to communicate with network components, and other user equipment within its communication range. Communications component 605 may also include one or more broadband and/or narrowband transceivers and/or other similar types of wireless transceiver configurable to communicate via a wireless network for infrastructure communications. Communications component 605 may also include one or more local area network or personal area network transceivers, such as a Wi-Fi transceiver or a Bluetooth transceiver.

Device 600 may perform one or more processes described herein. For example, device 600 may perform these processes based on processor 620 executing software instructions stored by a non-transitory computer-readable medium, such as storage component 625. As used herein, the term "computer-readable medium" refers to a non-transitory memory device. Software instructions may be read into storage component 625 from another computer-readable medium or from another device via communications component 605. When executed, software instructions stored in storage component 625 may cause processor 620 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 6 are provided as an example. In practice, device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

The foregoing disclosure provides illustrative and descriptive implementations but is not intended to be exhaustive or to limit the implementations to the precise form disclosed herein. One of ordinary skill in the art will appreciate that various modifications and changes can be made without departing from the scope of the present disclosure as set forth in the claims below. Accordingly, the specification and figures are to be regarded in an illustrative rather than a restrictive sense, and all such modifications are intended to be included within the scope of present teachings.

As used herein, the term "component" is intended to be broadly construed as hardware, firmware, and/or a combination of hardware and software. It will be apparent that systems and/or methods described herein may be implemented in different forms of hardware, firmware, and/or a combination of hardware and software.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Furthermore, as used herein, the term "set" is intended to include one or more items (e.g., related items, unrelated items, a combination of related items, unrelated items, and/or the like), and may be used interchangeably with "one of more." The term "only one" or similar language is used where only one item is intended. Further, the phrase "based on" is intended to mean "based, at least in part, on" unless explicitly stated otherwise.

Moreover, in this document, relational terms such as first and second, top and bottom, and the like, may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", or "contains . . . a" does not, without more constraints, preclude the existence of additional identical elements in the process, method, article, or apparatus that comprises, has, includes, contains the element. The terms "substantially", "essentially", "approximately", "about" or any other version thereof, are defined as being close to as understood by one of ordinary skill in the art, and in one non-limiting implementation, the term is defined to be within 10%, in another implementation within 5%, in another implementation within 1% and in another implementation within 0.5%. The term "coupled" as used herein is defined as connected, although not necessarily directly and not necessarily mechanically. A device or structure that is "configured" in a certain way is configured in at least that way but may also be configured in ways that are not listed.

We claim:

1. A storage device to allocate a thermal region tag (TRT) to a meta block based on a programming temperature and other conditions that may affect an optimal TRT parameter, the storage device comprises:

a memory device including meta blocks to store host and control data;

a controller to program a first meta block, obtain a current temperature, a first TRT associated with the current temperature, and a parameter associated with the first TRT when closing the first meta block, determine if a condition exists to affect the optimal TRT parameter, and if the condition exists, deactivate the first TRT, allocate a second TRT to a thermal region including the current temperature, and assign the second TRT to the first meta block.

2. The storage device of claim 1, wherein the parameter is a period when the first TRT was created and first allocated to a previous meta block.

3. The storage device of claim 1, wherein the parameter is a current time retrieved from a host device.

4. The storage device of claim 1, wherein the parameter is a calculated time.

5. The storage device of claim 1, wherein the optimal TRT parameter includes a read sense voltage.

6. The storage device of claim 1, wherein the condition is whether the first TRT has been active for more than a predefined active period.

7. The storage device of claim 1, wherein the condition includes a temperature fluctuation across a predefined number of thermal regions during previous meta blocks programming.

8. The storage device of claim 1, wherein the condition includes checking if a number of meta blocks assigned to the first TRT is greater than a TRT compaction threshold.

9. The storage device of claim 1, wherein when the controller allocates the second TRT to the thermal region, the controller assigns the second TRT as the active TRT for the thermal region and updates TRT parameters for the second TRT.

10. The storage device of claim 1, wherein the controller assigns the second TRT to the thermal region for a predefined active period.

11. A method for allocating a thermal region tag (TRT) to a meta block in a storage device based on a programming temperature and other conditions that may affect an optimal TRT parameter, the storage device includes a controller to execute the method comprising:

programming a first meta block;

obtaining a current temperature, a first TRT associated with the current temperature, and a parameter associated with the first TRT when closing the meta block;

determining if a condition exists to affect the optimal TRT parameter; and if the condition exists, deactivating the first TRT, allocating a second TRT to a thermal region including the current temperature, and assigning the second TRT to the first meta block.

12. The method of claim 11, further comprising obtaining at least one of a period when the first TRT was created and first allocated to a previous meta block, a current time from a host device, and a calculated time.

13. The method of claim 11, wherein the optimal TRT parameter is a read sense voltage.

14. The method of claim 11, wherein determining further comprises determining whether the first TRT has been active for more than a predefined active period.

15. The method of claim 11, wherein determining further comprises determining whether a temperature fluctuation across a predefined number of thermal regions occurred during previous meta blocks programming.

16. The method of claim 11, wherein determining further comprises determining whether a number of meta blocks assigned to the first TRT is greater than a TRT compaction threshold.

17. The method of claim 11, wherein assigning the second TRT further comprises allocating the second TRT to the thermal region, assigning the second TRT as the active TRT for the thermal region, and updating a TRT parameter for the second TRT.

18. The method of claim 11, wherein assigning the second TRT further comprises assigning the second TRT to the thermal region for a predefined active period.

19. A storage device to allocate a thermal region tag (TRT) to a meta block based on a programming temperature and other conditions that may affect an optimal TRT parameter, the storage device comprises:

a memory device including meta blocks to store host and control data;

a controller to:

program the meta block, obtain a current temperature, a first TRT associated with the current temperature, and a parameter associated with the first TRT when closing the meta block, determine that at least one of the first TRT has been active for more than a predefined active period, a temperature fluctuation across a predefined number of thermal regions occurred during previous meta blocks programming, and a number of meta blocks assigned to the first TRT is greater than a TRT compaction threshold, and deactivate the first TRT, allocate a second TRT to a thermal region including the current temperature, and assign the second TRT to the meta block.

20. The storage device of claim 19, wherein the second TRT is assigned to the thermal region for a predefined active period.

* * * * *